United States Patent [19]

Tsujimura et al.

[11] Patent Number: 5,663,974

[45] Date of Patent: Sep. 2, 1997

[54] SEMICONDUCTOR LASER

[75] Inventors: Ayumu Tsujimura, Mishima-gun; Kazuhiro Okawa, Hirakata; Satoshi Kamiyama, Sanda; Tsuneo Mitsuyu, Hirakata, all of Japan

[73] Assignee: Matsushita Electric Industrial Co., Ltd., Kadoma, Japan

[21] Appl. No.: 555,284

[22] Filed: Nov. 8, 1995

[30] Foreign Application Priority Data

Nov. 11, 1994 [JP] Japan .................. 6-277555

[51] Int. Cl.⁶ .................................................. H01S 3/19
[52] U.S. Cl. .................................................. 372/45
[58] Field of Search ........................... 372/45; 257/78

[56] References Cited

U.S. PATENT DOCUMENTS

5,351,255  9/1994  Schetzina .................. 372/45

Primary Examiner—James W. Davie
Attorney, Agent, or Firm—Renner, Otto, Boisselle & Sklar

[57] ABSTRACT

A semiconductor laser of the present invention includes: a $Zn_{1-x}Cd_xSe$ active layer ($0<X\leq0.3$); a pair of optical confinement structures for interposing the $Zn_{1-x}Cd_xSe$ active layer therebetween; and a pair of cladding layers for interposing the optical confinement structures and the $Zn_{1-x}Cd_xSe$ active layer therebetween, wherein an energy band gap of the optical confinement structure monotonously increases as a distance from the $Zn_{1-x}Cd_xSe$ active layer increases.

10 Claims, 5 Drawing Sheets

SEMICONDUCTOR LASER

BACKGROUND OF THE INVENTION

1. Field of the Invention

The present invention relates to a structure of a semiconductor laser, in particular, a structure of semiconductor laser using a II–VI compound semiconductor, which oscillates in a blue-green region.

2. Description of the Related Art

A blue-green II–VI compound semiconductor laser has been reported in, for example, Appl. Phys. Lett. 62, 2462 (1993). This semiconductor laser includes: a $Zn_{0.8}Cd_{0.2}Se$ single quantum-well active layer (thickness: 6.5 nm); a pair of $ZnS_{0.06}Se_{0.94}$ optical confinement layers sandwiching the active layer; and a pair of $Zn_{0.9}Mg_{0.1}S_{0.1}Se_{0.9}$ cladding layers sandwiching the pair of optical confinement layers and the active layer. One of the pair of $ZnS_{0.06}Se_{0.94}$ optical confinement layers is doped with a p-type impurity, and the other is doped with an n-type impurity. It has been reported that this semiconductor laser oscillates at room temperature and emits a laser beam having a wavelength of 516 nm.

However, the above-mentioned semiconductor laser is disadvantageous in that a threshold current is relatively high. This is because an optical confinement factor with respect to the active layer is not sufficiently high.

The laser oscillation initiates when a mode gain becomes equal to a threshold loss of a laser resonator cavity. The threshold loss is inversely proportional to the optical confinement factor. Therefore, the larger the optical confinement factor is, the lower a current for driving the semiconductor laser can be. Since the optical confinement factor is relatively low, i.e., 1.7% in the above-mentioned semiconductor laser, a threshold current thereof is relatively high, i.e., 240 mA.

SUMMARY OF THE INVENTION

The semiconductor laser of this invention includes:

a $Zn_{1-X}Cd_XSe$ active layer ($0<X\leq 0.3$);

a pair of optical confinement structures for interposing the $Zn_{1-X}Cd_XSe$ active layer therebetween; and a pair of cladding layers for interposing the optical confinement structures and the $Zn_{1-X}Cd_XSe$ active layer therebetween, wherein an energy band gap of the optical confinement structure monotonously increases as a distance from the $Zn_{1-X}Cd_XSe$ active layer increases.

In one embodiment of the present invention, at least one of the optical confinement structures includes at least a first $Zn_ZMg_{1-Z}S_USe_{1-U}$ layer ($0<Z\leq 1$, $0<U<1$) and a second $Zn_ZMg_{1-Z}S_{U'}Se_{1-U'}$ layer ($0<Z'<Z$, $U<U'<1$).

In another embodiment of the present invention, at least one of the cladding layers is made of $Zn_VMg_{1-V}S_WSe_{1-W}$ ($0<V\leq Z'$, $U'\leq W<1$).

In still another embodiment of the present invention, at least one of the optical confinement structures further includes a $Zn_{1-Y}Cd_YSe$ layer ($0\leq Y<X\leq 0.3$) which is interposed between the $Zn_{1-X}Cd_XSe$ active layer ($0<X\leq 0.3$) and the first $Zn_ZMg_{1-Z}S_USe_{1-U}$ layer ($0<Z\leq 1$, $0<U<1$).

In Still another embodiment of the present invention, the $Zn_{1-X}Cd_XSe$ active layer and the optical confinement structures substantially contain neither a p-type impurity nor an n-type impurity.

In still another embodiment of the present invention, the $Zn_{1-X}Cd_XSe$ active layer and the optical confinement structures contain neither a p-type impurity nor an n-type impurity, and the cladding layers contain a p-type impurity and an n-type impurity.

In still another embodiment of the present invention, an energy band gap of at least one of the optical confinement structures increases in a stepwise manner as the distance from the $Zn_{1-X}Cd_XSe$ active layer increases.

In still another embodiment of the present invention, an energy band gap of at least one of the optical confinement structures gradually and smoothly increases as the distance from the $Zn_{1-X}Cd_XSe$ active layer increases.

In still another embodiment of the present invention, an energy band gap of at least one of the optical confinement structures parabolically increases as the distance from the $Zn_{1-X}Cd_XSe$ active layer increases.

In still another embodiment of the present invention, at least one of the optical confinement structures further includes a $Zn_{1-Y'}Cd_{Y'}Se$ layer ($0\leq Y'<Y$) positioned between the $Zn_{1-Y}Cd_YSe$ layer ($0\leq Y<X\leq 0.3$) and the first $Zn_ZMg_{1-Z}S_USe_{1-U}$ layer ($0<Z\leq 1$, $0<U<1$).

Thus, the invention described herein makes possible the advantage of providing a semiconductor laser oscillating in a blue-green region, and having an improved optical confinement factor.

This and other advantages of the present invention will become apparent to those skilled in the art upon reading and understanding the following detailed description with reference to the accompanying figures.

DESCRIPTION OF THE PREFERRED EMBODIMENTS

A semiconductor laser according to the present invention includes: a $Zn_{1-X}Cd_XSe$ active layer ($0<X\leq 0.3$); an optical confinement structure adjacent to the $Zn_{1-X}Cd_XSe$ active layer; and a cladding layer adjacent to the optical confinement structure. Since an energy band gap of the optical confinement structure monotonously increases as a distance from the $Zn_{1-X}Cd_XSe$ active layer increases, an effective refractive index with respect to a laser beam decreases as a distance from the $Zn_{1-X}Cd_XSe$ active layer increases.

In the specification, the term "monotone increase" includes not only gradual smooth increase but also stepwise increase. Similarly, the term "monotone decrease" includes not only gradual smooth decrease but also stepwise decrease.

Since the energy band gap of the optical confinement structure monotonously increases as a distance from the active layer increases, carriers are prevented from overflowing into the respective cladding layers. An effective refractive index of the optical confinement structure monotonously decreases as a distance from the active layer increases, an optical confinement factor approaches a theoretically optimal value. As a result, a threshold current of the laser is decreased, thereby improving the reliability of the laser device.

It is most preferable that an index profile of the optical confinement structure is parabolic in view of enhancement of the optical confinement factor. A III–V compound semiconductor laser having such a parabolic index profile has been reported in Appl. Phys. Lett. 39 (2) issued on 15 Jul. 1981.

In order to make the index profile of the optical confinement structure closer to parabolic, it is sufficient to grow a plurality of ZnMgSSe layers having respectively different energy band gaps and appropriate thicknesses to form an optical confinement structure. For example, it is sufficient to grow a first $Zn_ZMg_{1-Z}S_USe_{1-U}$ layer ($0<Z\leq1$, $0<U<1$) and a second $Zn_ZMg_{1-Z}S_USe_{1-U'}$ layer ($0<Z'<Z$, $U<U'<1$). The energy band gap of the second $Zn_ZMg_{1-Z}S_USe_{1-U'}$ layer ($0<Z'<Z$, $U<U'<1$) is higher than that of the first $Zn_ZMg_{1-Z}S_USe_{1-U}$ layer ($0<Z\leq1$, $0<U<1$).

The optical confinement structures are formed over and under the active layer so as to interpose the active layer therebetween. It is not necessary that the optical confinement structure formed under the active layer and that formed over the active layer have the same index profile. Even with optical confinement structures which are asymmetrical with respect to the center of the active layer, an optical confinement factor is improved. However, symmetrical optical confinement structures with respect to the center of the active layer are more suitable for making the cross-sectional shape of a laser beam symmetrical.

If a plurality of semiconductor layers having respectively different energy band gaps (respectively different refractive indices) are grown, a refractive index of the optical confinement structure changes in a stepwise manner. On the other hand, if a composition ratio of a semiconductor layer is gradually and smoothly changed while growing the semiconductor layer, an optical confinement layer having gradually and smoothly changing energy band gap and refractive index can be obtained.

With conventional methods, however, it was extremely difficult to deposit a ZnMgSSe layer having varying energy band gap by molecular beam epitaxy (MBE method).

In addition to the above-mentioned structure, the configuration in which a $Zn_{1-Y}Cd_YSe$ layer ($0\leq Y<X\leq0.3$) is further provided between the $Zn_{1-X}Cd_XSe$ active layer ($0<X\leq0.3$) end the first $Zn_ZMg_{1-Z}S_USe_{1-U}$ layer ($0<Z\leq1$, $0<U<1$) is preferable since a smoother index profile is formed to approach the ideal index profile. This is because the energy band gap of the $Zn_{1-Y}Cd_YSe$ ($0\leq Y<X\leq0.3$) layer has an intermediate value between the energy band gaps of the $Zn_{1-X}Cd_XSe$ ($0<X\leq0.3$) active layer and the first $Zn_ZMg_{1-Z}S_USe_{1-U}$ layer ($0<Z\leq1$, $0<U<1$).

By growing a plurality of semiconductor layers to form an optical confinement layer, not only the index profile optical confinement but also carrier confinement in the active layer can be optimized. In particular, if $Zn_VMg_{1-V}S_WSe_{1-W}$ ($0<V\leq Z'$, $U'\leq W<1$) is used as a cladding layer, the optical confinement and inhibition of overflow of carriers can be further realized with higher efficiency.

In the case where the $Zn_{1-X}Cd_XSe$ active layer and the optical confinement structure do not substantially contain a p-type impurity and an n-type impurity, an impurity level is formed neither in the active layer nor in the vicinity of the interface of the active layer. Thus, the efficiency of carrier recombination emission is improved, thereby improving the operation characteristics of the laser.

Hereinafter, a semiconductor laser according to the present invention will be described in detail by way of illustrative drawings.

EXAMPLE 1

Figure 1:
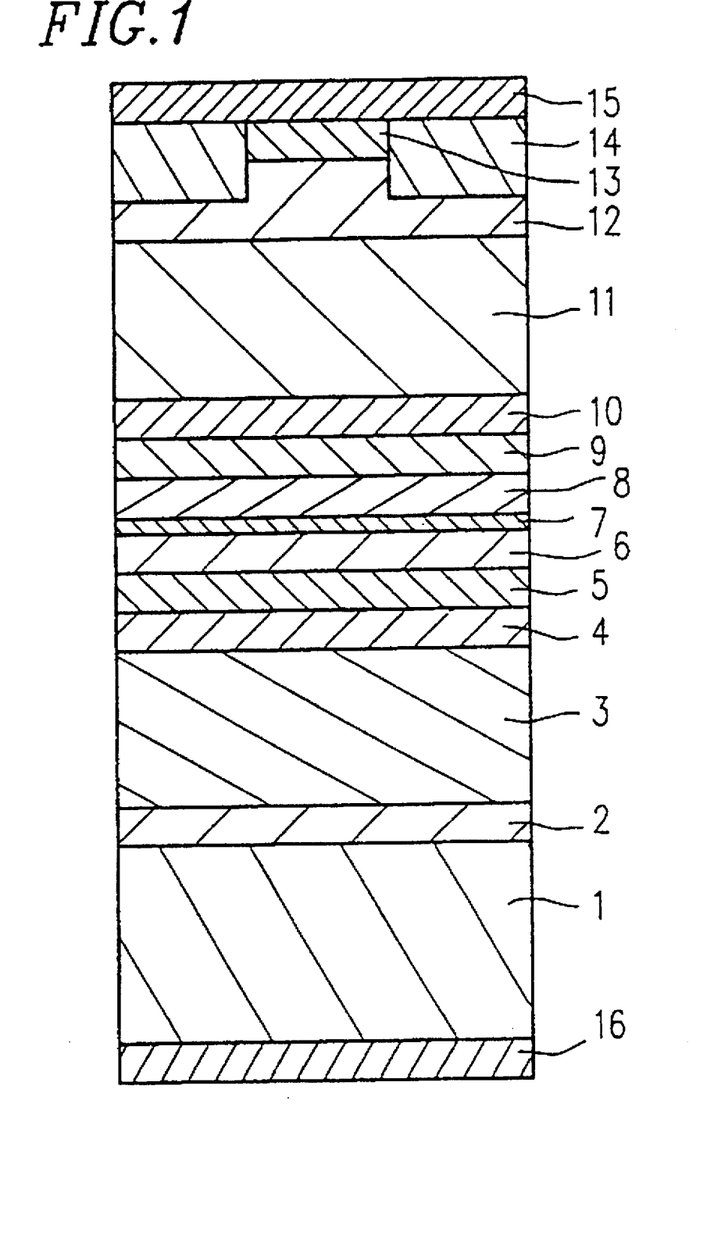
FIG. 1 is a cross-sectional view showing an example of a semiconductor laser device according to the present invention.

FIG. 1 is a cross-sectional view schematically showing a first example of the present invention. A semiconductor laser according to Example 1 includes: a lower optical confinement structure interposed between a ZnCdSe active layer 7 (thickness: about 6 nm) and an n-type ZnMgSSe cladding layer 3 (thickness: about 0.8 µm) doped with Cl serving as an n-type impurity; and an upper optical confinement structure interposed between the ZnCdSe active layer 7 and a p-type ZnMgSSe cladding layer 11 (thickness: about 0.7 µm) doped with N serving as a p-type impurity.

The lower optical confinement structure includes: a ZnMgSSe optical confinement layer 4 (thickness: about 20 nm); a ZnSSe optical confinement layer 5 (thickness: about 30 nm); and a ZnCdSe optical confinement layer 6 (thickness: about 27 nm). The upper optical confinement structure includes: a ZnCdSe optical confinement layer 8 (thickness: about 27 nm); a ZnSSe optical confinement layer 9 (thickness: about 30 nm); and a ZnMgSSe optical confinement layer 10 (thickness: about 20 nm).

An n-type ZnSe buffer layer 2 (thickness: about 30 nm) doped with Cl serving as an n-type impurity is formed on an n-type GaAs(100) substrate 1 doped with Si serving as an n-type impurity. On the n-type ZnSe buffer layer 2, the cladding layer 3, the lower confinement structure, the ZnCdSe active layer 7, the upper confinement structure and the p-type ZnMgSSe cladding layer 11 are deposited in this order.

A p-type ZnSSe cap layer 12 (thickness: about 0.3 µm) doped with N serving as a p-type impurity is formed on the p-type ZnMgSSe cladding layer 11. The p-type ZnSSe cap layer 12 has a stripe-shaped ridge (height: about 0.1 µm, width: about 10 µm). On the stripe-shaped ridge, a p-type ZnSeTe contact layer 13 (thickness: about 55 nm) doped with N serving as a p-type impurity is formed. ZnS films 14 are formed on both sides of the ridge. The ZnS films 14 serve to restrict a current within a region having a predetermined width. An Au/Pd electrode 15 is formed as a p-type electrode on the upper surface of the semiconductor multilayer structure, and an In electrode 16 is formed as an n-type electrode on the bottom face of the n-type GaAs substrate 1.

Figure 2A:
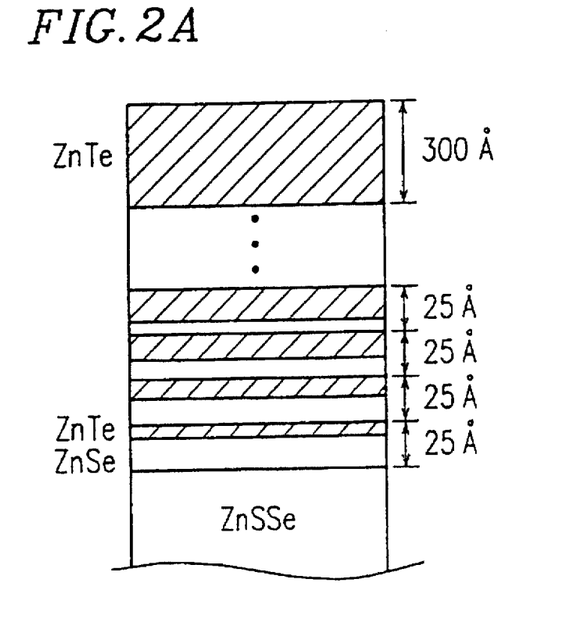
FIGS. 2A and 2B are cross-sectional views showing a p-type ZnSeTe contact layer used for the semiconductor laser shown in FIG. 1.
Figure 2B:
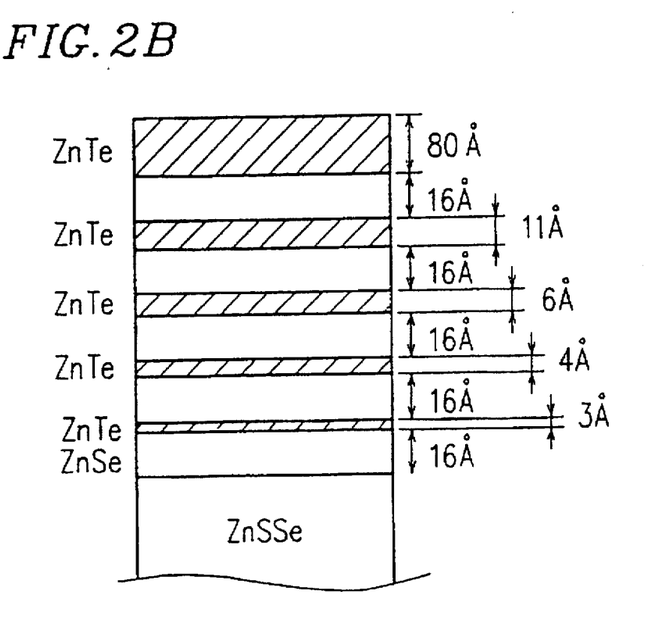

More specifically, the p-type ZnSeTe contact layer 13 has such a configuration that a plurality of ZnSe layers and ZnTe layers are alternately deposited in a periodic manner, as shown in FIGS. 2A and 2B. In the case of FIG. 2A, the structure consisting of about ten pairs of a ZnSe layer and a ZnTe layer is formed as the p-type ZnSeTe contact layer 13 while keeping a total thickness of one pair of a ZnSe layer and a ZnTe layer constant, i.e., to 2.5 nm. The pairs of a ZnSe layer and a ZnTe layer are formed so that a thickness ratio of the ZnSe layer to the ZnTe layer is about 23:2 in the lowermost pair of the structure and a thickness ratio of the ZnSe layer to the ZnTe layer is about 2:23 in the uppermost pair of the structure. The uppermost ZnTe layer is formed so as to have a thickness of 30 nm, thereby forming the p-type ZnSeTe contact layer 13. In the case of FIG. 2B, the structure consisting of about ten pairs of a ZnSe layer and a ZnTe layer is formed as the p-type ZnSeTe contact layer 13 while keeping 8 thickness of the ZnSe layer constant, for example, to 1.6 nm and gradually and smoothly increasing a thickness of the ZnTe layer. A thickness of the ZnTe layer is set at 0.3 nm in the lowermost pair and at 8 nm in the uppermost pair.

In both cases, the ZnTe layer is formed in the region of the p-type ZnSeTe contact layer 13 in contact with the Au/Pd electrode 15, which is necessary to form an ohmic contact. The Au/Pd electrode 15 includes a Pd lower layer having a thickness of 10 nm and an Au upper layer having a thickness of 250 nm.

Figure 3:
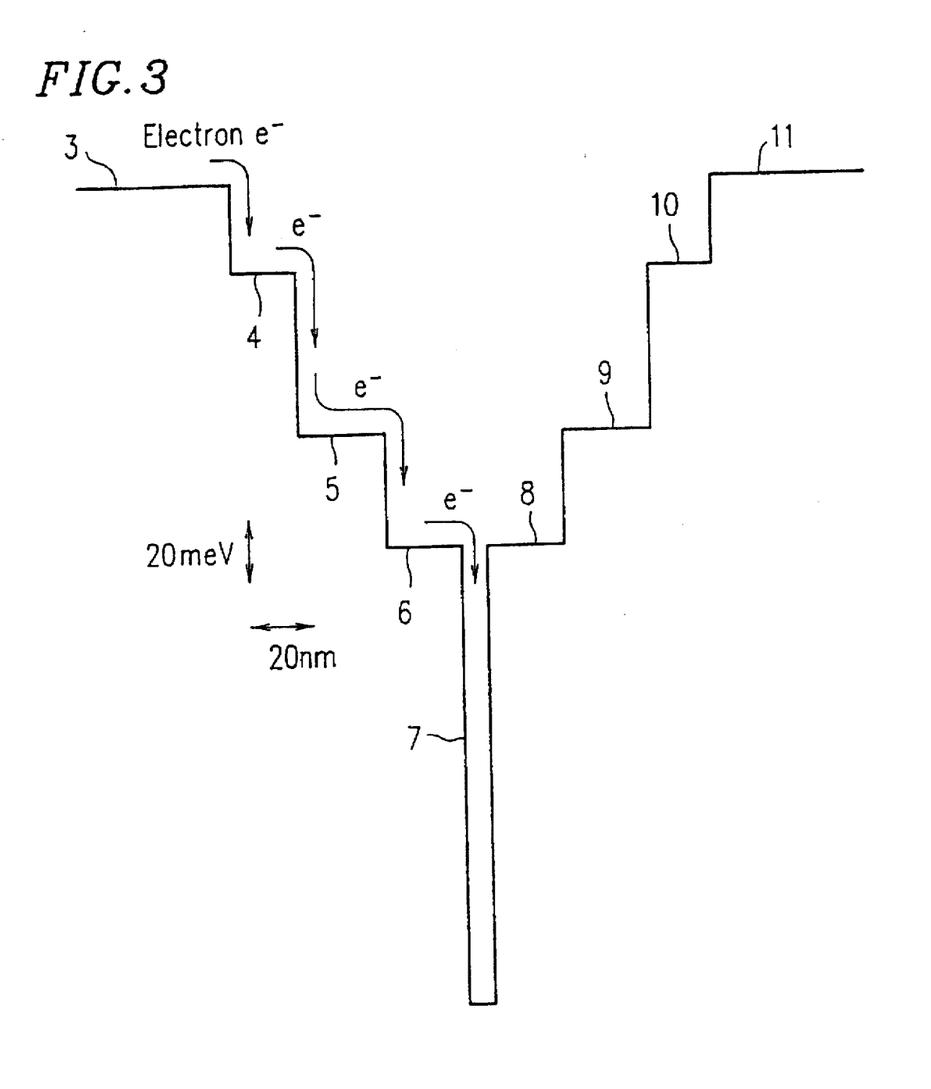
FIG. 3 is an energy band diagram relating to a conduction band of an active layer and optical confinement structures of the semiconductor laser shown in FIG. 1.

FIG. 3 is an energy band diagram regarding a conduction band of the active layer 7 and the optical confinement structures. The band offset between the cladding layers 3 and 11 and the active layer 7 is sufficiently large (band offset on the conduction band side is 0.26 eV). Therefore, carriers are effectively confined in the active layer 7 without overflowing into the cladding layers 3 and 11 within a practical temperature region equal to or higher than room temperature.

In view of a refractive index and a thickness of each of the layers constituting the laser structure, thicknesses of the optical confinement layers are designed so that an optimal optical confinement effect can be obtained. In Example 1, by adopting an optical confinement structure as shown in FIG. 3, an optical confinement factor in the active layer 7 is improved to be 2.3%, which is 1.5 times the optical confinement factor obtained by a conventional method under the same conditions. As a result, an operating current of the laser can be reduced to about two-thirds of a conventional operating current. Moreover, since a refractive index of the optical confinement structure is decreased substantially in proportion to the second power of a distance from the center of the active layer 7 by adopting such an optical confinement structure, a laser beam emitted from the laser device preferably serves as a Gussian beam.

The same principle as described above can be applied to a thickness of each of the semiconductor layers constituting the upper optical confinement structure.

Although the GaAs substrate is used as the substrate 1 in Example 1, a material of the substrate 1 is not limited to GaAs. For example, if a laser device is produced using a ZnSe substrate, a defect due to hetero-epitaxial growth; which is caused in the case where the GaAs substrate is used, is prevented from occurring at the interface with the substrate. Thus, laser characteristics with higher reliability can be obtained in the case where the ZnSe substrate is used.

Hereinafter, a method for producing the semiconductor laser shown in FIG. 1 will be described. In Example 1, each of the semiconductor layers is grown using a molecular beam epitaxy. More particularly, polycrystalline ZnSe, ZnS, CdSe, ZnTe and metal Mg serving as materials are heated and evaporated in a high vacuum in the range of $10^{-5}$ to $10^{-10}$ Torr, thereby forming molecular beams. By simultaneously radiating the plurality of molecular beams onto the n-type GaAs substrate 1, a single-crystalline semiconductor layer is grown on the substrate 1. $ZnCl_2$ is radiated for n-type doping, and active nitrogen obtained by forming nitrogen plasma is radiated for p-type doping during crystal growth. During crystal growth, it is preferred that a temperature of the substrate 1 is set to be in the range of 260° to 330° C. In Example 1, a temperature of the substrate 1 is kept to 280° C.

First, the n-type ZnSe buffer layer 2 is epitaxially grown on the substrate 1 to about 30 nm. Since ZnSe exhibits lattice mismatch of 0.28% with respect to GaAs at room temperature, it is necessary to form the n-type ZnSe buffer layer 2 so as to be sufficiently thinner than a critical thickness (about 150 nm) at which lattice is relaxed to cause dislocation. Cl serving as an n-type impurity is doped so that an effective donor density is about $6 \times 10^{17}$ cm$^{-3}$.

Next, the n-type $Zn_{0.93}Mg_{0.07}S_{0.13}Se_{0.87}$ cladding layer 3 is epitaxially grown to about 0.8 μm. ZnMgSSe having this composition substantially lattice matches with GaAs. An effective donor density is set to be about $6 \times 10^{17}$ cm$^{-1}$. A forbidden band width of the n-type $Zn_{0.93}Mg_{0.07}S_{0.13}Se_{0.87}$ cladding layer 3 is about 2.83 eV at room temperature.

Subsequently, the semiconductor layers constituting the optical confinement structures and the active layer 7 are epitaxially grown in a continuous manner. Specifically, the $Zn_{0.95}Mg_{0.05}S_{0.09}Se_{0.91}$ optical confinement layer 4 having a thickness of about 20 nm, the $ZnS_{0.06}Se_{0.94}$ optical confinement layer 5 having a thickness of about 30 nm and the $Zn_{0.96}Cd_{0.04}Se$ optical confinement layer 6 having a thickness of 27 nm are epitaxially grown in this order. Next, a $Zn_{0.8}Cd_{0.2}Se$ layer serving as the active layer 7 is grown so as to have a thickness of about 6 nm. Then, the $Zn_{0.96}Cd_{0.04}Se$ optical confinement layer 8 having a thickness of 27 nm, the $ZnS_{0.06}Se_{0.94}$ optical confinement layer 9 having a thickness of about 30 nm, and the $Zn_{0.95}Mg_{0.05}S_{0.09}Se_{0.91}$ optical confinement layer 10 having a thickness of about 20 nm are epitaxially grown in this order so as to have a symmetrical configuration with respect to the active layer 7.

In Example 1, as described above, polycrystalline compound effusion cell sources are used as molecular beam effusion cell sources for MBE growth. In the case where distinct effusion cell sources for individual constituting elements (for example, Zn, Se or Te) are used instead of the polycrystalline compound effusion cell sources such as ZnSe, ZnS, CdSe and ZnTe, a large number of molecular beam cell sources are required, making it difficult to adjust the intensity of each molecular beam with good reproducibility. There is a great difference between a III–V compound semiconductor such as AlGaAs and the II–VI compound semiconductor used in the present invention with respect to difficulty in controlling the composition during MBE growth. In the case of AlGaAs, a ratio of intensity of a molecular beam of a III element to intensity of a molecular beam of a V element (V/III ratio) is set within the range of 10 to 30. Accordingly, an AlGaAs layer is grown while As is excessively supplied. A composition ratio of the AlGaAs layer is adjusted by controlling the intensity of a molecular beam of Ga alone. Therefore, it is relatively easy to continuously form the AlGaAs layer having varying band gaps (refractive indices).

On the other hand, in the case of ZnCdSe or ZnMgSSe, a ratio of intensity of a molecular beam of a II element and intensity of a molecular beam of a VI element (VI/II ratio) is required to be set at about 1. Therefore, in the case where the composition is adjusted, it is necessary that the intensity of a molecular beam with respect to each element should be adjusted while keeping a VI/II ratio, that is, (Zn+Cd)/Zn or (Zn+Mg)/(Se+S) to about 1. Therefore, if the layers are intended to be grown using a large number of unit effusion cell sources, it is necessary to carefully adjust the intensity of a large number of molecular beams, making it difficult to control the composition with high accuracy. However, the use of a polycrystalline compound effusion cell source is extremely preferable for forming the optical confinement structures of the present invention because it has the following advantages.

The number of molecular beam cells is reduced.

The molecular beams are formed at a relatively high cell temperature (about 600° to about 1000° C.).

The intensity of molecular beam reaches equilibrium intensity within a relatively short period of time (about one second to about one minute) after a cell shutter is opened.

The intensity of a beam is normally adjusted by controlling the cell temperature or the degree of aperture of the cell shutter. In either method, the beam intensity can be stably controlled with good reproducibility in the case where the compound effusion cell source is used. In the case where a plurality of II–VI layers serving as optical confinement layers are grown as in Example 1, the II–VI layers having respectively desired compositions can be extremely easily obtained if a plurality of effusion cell sources for growing the II–VI layers are previously prepared in an MBE apparatus.

Although the optical confinement layers 4, 5, 9 and 10 substantially lattice match with GaAs, $Zn_{1-x}Cd_xSe$ lattice mismatches with GaAs. In Example 1, however, the thickness of the active layer 7 and the optical confinement layers 6 and 8 maintain lattice match while containing compression strain therein since their thicknesses do not reach a critical thickness (about 30 nm) at which lattice relaxation is caused. However, a composition X exceeding 0.3 is not preferable. This is because lattice mismatch becomes greater than 2%, resulting in incapability of maintaining good crystal quality.

In terms of good crystalinity, it is preferable that thicknesses of the $Zn_{1-x}Cd_xSe$ optical confinement layers 6 and 8 are about 60 nm or less. It is preferable that the total thickness of the lower optical confinement structure is in the range of about 70 to 130 nm. Similarly, it is preferable that the total thickness of the upper optical confinement structure is in the range of about 70 to 130 nm. If the total thickness of the upper optical confinement structure is smaller than about 70 nm, the amount of light leaking into the cladding layer increases to significantly reduce the optical confinement factor in the active layer, thereby increasing a threshold current. If the total thickness of the upper optical confinement structure exceeds about 130 nm, a refractive index of the cladding layer less contributes to the optical confinement to reduce the difference in effective refractive index between the active layer and the optical confinement structure, thereby reducing an optical confinement factor.

It is preferable that the thickness of the active layer 7 is in the range of about 2 to 20 nm. If the thickness of the active layer 7 is smaller than 2 nm, not only a laser gain is likely to be saturated but also fluctuation in the compositions greatly contributes to the steepness of change in compositions at an interface between the active layer and a layer adjacent thereto, resulting in an increase in a driving current density. If the thickness of the active layer 7 exceeds 20 nm, dislocation occurs in the active layer due to lattice relaxation to significantly deteriorate the laser characteristics.

Moreover, when compressive strain or tensile strain is imposed on the active layer, the degeneracy of a heavy hole band, a light hole band and a spin orbital separation band constituting a valence band is released to decrease a threshold value gain of laser oscillation. Therefore, in order to lower an oscillation threshold current, it is effective to introduce strain into the active layer.

The region from the $Zn_{0.95}Mg_{0.05}S_{0.09}Se_{0.91}$ optical confinement layer 4 to the $Zn_{0.95}Mg_{0.05}S_{0.09}Se_{0.91}$ optical confinement layer 10 is not doped with an impurity. As a result, since an impurity level is not formed in the active layer 7 and the vicinity of the interface with the optical confinement layer, the efficiency of carrier recombination emission can be improved, thereby improving the operation characteristics of the laser.

On the $Zn_{0.95}Mg_{0.05}S_{0.09}Se_{0.91}$ optical confinement layer 10, the p-type $Zn_{0.93}Mg_{0.07}S_{0.13}Se_{0.87}$ cladding layer 11, the p-type $ZnS_{0.06}Se_{0.94}$ cap layer 12 and the p-type ZnSeTe contact layer 13 are epitaxially grown to thicknesses of about 0.7 μm, about 0.3 μm and about 20 nm, respectively, in this order. The effective acceptor densities of the respective layers are about $2\times10^{17}$ cm$^{-3}$, about $4\times10^{17}$ cm$^{-3}$ and about $5\times10^{18}$ cm$^{-3}$, respectively.

A wafer having the laser structure obtained by epitaxial growth described above is processed into a ridge-type laser device. Specifically, a ridge having a width of 10 μm and a depth of 0.1 μm is formed by wet etching using a photoresist as a mask. An etchant containing a potassium dichromate saturated solution and concentrated sulfuric acid at a volume ratio of 3:2 is used for etching. Next, the ZnS insulating films 14 are grown to a thickness of 0.1 μm on the respective sides. Then, the p-type ZnSeTe contact layer 13 is exposed by lift-off. Pd and Au are successively deposited on the entire surface of the wafer, thereby providing the Pd/Au electrode 15 with respect to the p-type ZnSeTe contact layer 13. The In electrode 16 is provided on the bottom face of the n-type GaAs substrate 1.

The thus obtained wafer is cleaved to be divided into chips having a width of 500 μm without coating either end face while setting a resonator length at 700 nm. Each chip is mounted so that the In electrode 16 is in contact with a heat sink made of copper.

A current having a pulse width of 10 μs with repetition of 1 kHz (a duty ratio 1%) was injected into the semiconductor laser device at 24° C. As a result, blue-green laser oscillation was observed at 519 nm. A threshold value was 80 mA, end a threshold current density was 1.1 kA/cm$^2$.

Although the vicinity of the active layer has the single-quantum well structure with the optical confinement layers in Example 1, it is preferable that a multi-quantum well structure is adopted in order to obtain a high optical gain and effectively confine light.

The n-type substrate is used in Example 1. However, even when a p-type substrate is used and each of the layers has the opposite conductivity type to that used in Example 1, the similar effect can be obtained.

EXAMPLE 2

Next, with reference to FIG. 4, another semiconductor laser according to the present invention will be described.

Figure 4:
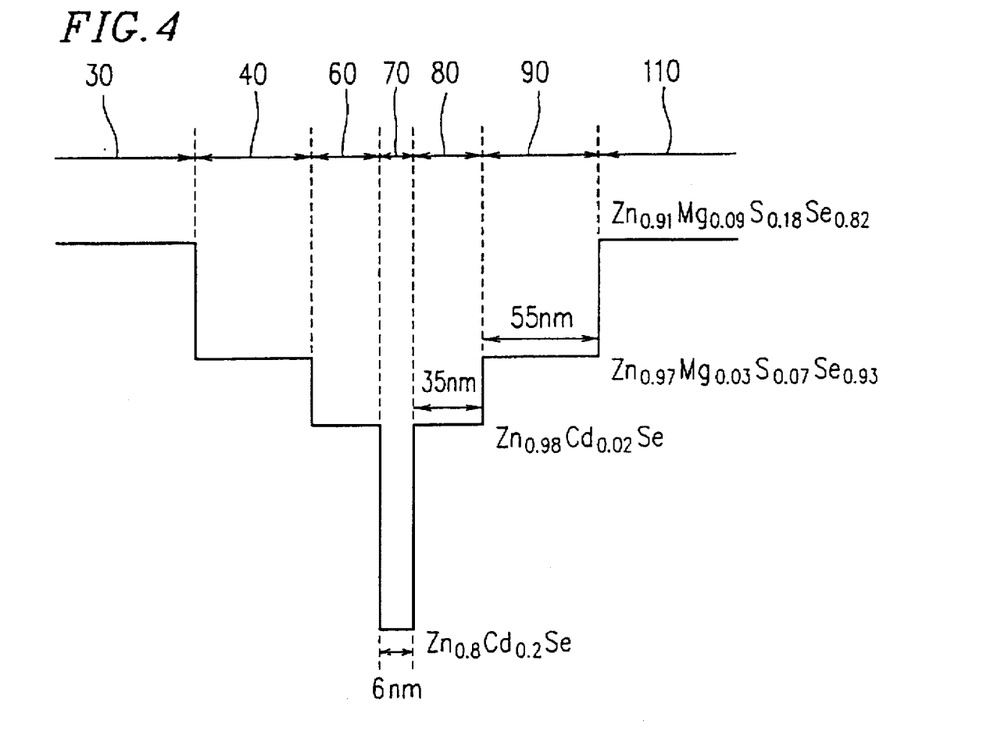
FIG. 4 is a cross-sectional view showing another example of a semiconductor laser device according to the present invention.

The semiconductor laser shown in FIG. 4 has the same configuration as that of the semiconductor laser shown in FIG. 1 except for the optical confinement structures. Hereinafter, only parts which are characteristic to Example 2 will be described.

The configuration of Example 2 is characterized by including: an n-type $Zn_{0.91}Mg_{0.09}S_{0.18}Se_{0.82}$ cladding layer 30; a $Zn_{0.97}Mg_{0.03}S_{0.07}Se_{0.93}$ optical confinement layer 40 (thickness: about 55 nm); a $Zn_{0.98}Cd_{0.02}Se$ optical confinement layer 60 (thickness: about 35 nm); a $Zn_{0.8}Cd_{0.2}Se$ active layer 70 (thickness: about 6 nm); a $Zn_{0.98}Cd_{0.02}Se$ optical confinement layer 80 (thickness: about 35 nm); a $Zn_{0.97}Mg_{0.03}S_{0.07}Se_{0.93}$ optical confinement layer 90 (thickness: about 55 nm); and an n-type $Zn_{0.91}Mg_{0.09}S_{0.18}Se_{0.82}$ cladding layer 110. More specifically, a lower optical confinement structure according to Example 2 consists of the $Zn_{0.97}Mg_{0.03}S_{0.07}Se_{0.93}$ optical confinement layer 40 and the $Zn_{0.98}Cd_{0.02}Se$ optical confinement layer 60, and an upper optical confinement structure according to Example 2 consists of the $Zn_{0.98}Cd_{0.02}Se$ optical confinement layer 80 and the $Zn_{0.97}Mg_{0.03}S_{0.07}Se_{0.93}$ optical confinement layer 90.

According to the above structure, it is possible to improve an optical confinement factor as compared with a conventional optical confinement factor with a simpler structure than that shown in FIG. 1.

EXAMPLE 3

Next, with reference to FIG. 5, still another semiconductor laser according to the present invention will be described.

Figure 5:
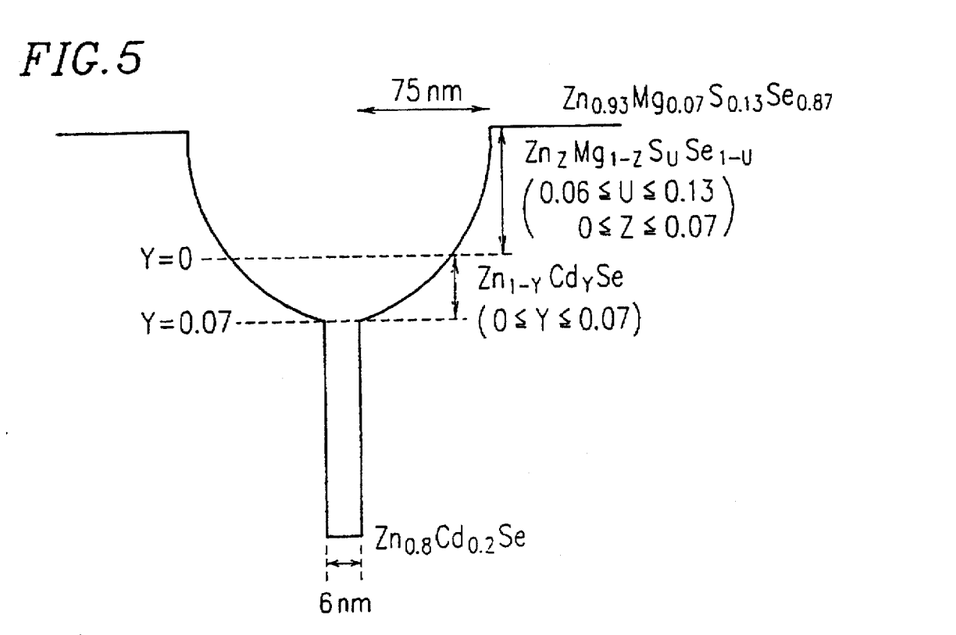
FIG. 5 is a cross-sectional view showing still another example of a semiconductor laser device according to the present invention.

The semiconductor laser shown in FIG. 5 has the same configuration as that of the semiconductor laser shown in FIG. 1 except for the optical confinement structures. Hereinafter, only parts which are characteristic to Example 3 will be described.

A lower optical confinement structure (total thickness: 75 nm) according to Example 3 includes: a $Zn_{1-Y}Cd_YSe$ layer ($0 \leq Y \leq 0.07$) which is grown while gradually and smoothly changing a composition ratio Y from 0.07 to 0; and a $Zn_ZMg_{1-Z}S_USe_{1-U}$ layer ($0 \leq Z \leq 1$, $0.06 \leq U \leq 0.13$) which is grown while gradually and smoothly changing a composition ratio Z from 0 to 0.07 and a composition ratio U from 0.06 to 0.13. An upper optical confinement structure (total thickness: 75 nm) according to Example 3 is symmetrical to the lower optical confinement structure. In addition, $Zn_{0.93}Mg_{0.07}S_{0.13}Se_{0.87}$ layers are provided so as to be adjacent to the respective optical confinement structures.

In Example 3, the change in each composition ratio of each of the semiconductor layers constituting the optical confinement structures is adjusted so that effective refractive indices of the $Zn_{1-Y}Cd_YSe$ layer ($0 \leq Y \leq 0.07$) and the $Zn_ZMg_{1-Z}S_USe_{1-U}$ layer ($0 \leq Z \leq 1$, $0.06 \leq U \leq 0.13$) parabolically change as the distance from the center of the active layer increases. As a result, an optical confinement factor is optimized.

According to a semiconductor laser of the present invention, since the energy band gap of the optical confinement structure monotonously increases as the distance from the $Zn_{1-X}Cd_XSe$ active layer increases, an effective refractive index with respect to a laser beam monotonously decreases as the distance from the $Zn_{1-X}Cd_XSe$ active layer increases. Thus, carriers are inhibited from overflowing into the cladding layer. Moreover, since an effective refractive index of the optical confinement structure monotonously decreases as the distance from the active layer increases, an optical confinement factor approaches a theoretically optimal value. As a result, an operating current of the laser is reduced, thereby improving the reliability of the laser device.

If the optical confinement structure is formed so as to include the first $Zn_ZMg_{1-Z}S_USe_{1-U}$ layer ($0<Z \leq 1$, $0<U<1$) and the second $Zn_{Z'}Mg_{1-Z'}S_{U'}Se_{1-U'}$ layer ($0<Z'<Z$, $U<U'<1$), an optical confinement factor can be improved with a relatively simple configuration. In particular, a more preferable index profile is obtained by providing the $Zn_{1-Y}Cd_YSe$ ($0<Y<X \leq 0.3$) layer, which has a band gap relatively close to that of the active layer as compared with the $Zn_ZMg_{1-Z}S_USe_{1-U}$ layer ($0<Z<1$, $0<U<1$), between the $Zn_{1-X}Cd_XSe$ active layer ($0<X \leq 0.3$) and the $Zn_ZMg_{1-Z}S_USe_{1-U}$ layer ($0<Z \leq 1$, $0<U<1$). As a result, an optical confinement factor can be further improved.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor laser comprising:

a $Zn_{1-X}Cd_XSe$ active layer ($0<X \leq 0.3$);

a pair of optical confinement structures for interposing the $Zn_{1-X}Cd_XSe$ active layer therebetween; and a pair of cladding layers for interposing the optical confinement structures and the $Zn_{1-X}Cd_XSe$ active layer therebetween, wherein at least one of the optical confinement structures includes a $Zn_{1-Y}Cd_YSe$ layer ($0 \leq Y<X \leq 0.3$) and a $Zn_ZMg_{1-Z}S_USe_{1-U}$ layer ($0<Z \leq 1$, $0<U<1$), at least one of the cladding layers is made of $Zn_VMg_{1-V}S_WSe_{1-W}$ ($0<V \leq Z$, $U \leq W<1$), and an energy band gap of the optical confinement structure monotonously increases as a distance from the $Zn_{1-X}Cd_XSe$ active layer increases.

2. A semiconductor laser according to claim 1, wherein the $Zn_{1-X}Cd_XSe$ active layer and the optical confinement structures substantially contain neither a p-type impurity nor an n-type impurity.

3. A semiconductor laser according to claim 1, wherein an energy band gap of at least one of the optical confinement structures increases in a stepwise manner as the distance from the $Zn_{1-X}Cd_XSe$ active layer increases.

4. A semiconductor laser according to claim 1, wherein an energy band gap of at least one of the optical confinement structures gradually and smoothly increases as the distance from the $Zn_{1-X}Cd_XSe$ active layer increases.

5. A semiconductor laser according to claim 1, wherein an energy band gap of at least one of the optical confinement structures parabolically increases as the distance from the $Zn_{1-X}Cd_XSe$ active layer increases.

6. A semiconductor laser comprising:

a $Zn_{1-X}Cd_XSe$ active layer ($0<X \leq 0.3$);

a pair of optical confinement structures for interposing the $Zn_{1-X}Cd_XSe$ active layer therebetween; and a pair of cladding layers for interposing confinement structures and the $Zn_{1-X}Cd_XSe$ active layer therebetween, wherein an energy band gap of the optical confinement structure monotonously increases as a distance from the $Zn_{1-X}Cd_XSe$ active layer increases, and at least one of the optical confinement structures includes at least a first $Zn_ZMg_{1-Z}S_USe_{1-U}$ layer ($0<Z \leq 1$, $0<U<1$) and a second $Zn_{Z'}Mg_{1-Z'}S_{U'}Se_{1-U'}$ layer ($0<Z'<Z$, $U<U'<1$).

7. A semiconductor laser according to claim 6, wherein at least one of the cladding layers is made of $Zn_VMg_{1-V}S_WSe_{1-W}$ ($0<V \leq Z'$, $U' \leq W<1$).

8. A semiconductor laser according to claim 6, wherein at least one of the optical confinement structures further includes a $Zn_{1-Y}Cd_YSe$ layer ($0 \leq Y<X \leq 0.3$) which is interposed between the $Zn_{1-X}Cd_XSe$ active layer ($0<X \leq 0.3$) and the first $Zn_ZMg_{1-Z}S_USe_{1-U}$ layer ($0<Z \leq 1$, $0<U<1$).

9. A semiconductor laser according to claim 7, wherein the $Zn_{1-X}Cd_XSe$ active layer and the optical confinement structures contain neither a p-type impurity nor an n-type impurity, and the cladding layers contain a p-type impurity and an n-type impurity.

10. A semiconductor laser according to claim 8, wherein the at least one of the optical confinement structures further includes a $Zn_{1-Y'}Cd_{Y'}Se$ layer ($0 \leq Y'<Y$) positioned between the $Zn_{1-Y}Cd_YSe$ layer ($0 \leq Y<X \leq 0.3$) and the first $Zn_ZMg_{1-Z}S_USe_{1-U}$ layer ($0 \leq Z 1$, $0<U<1$).

* * * * *